United States Patent

Hwang et al.

[11] Patent Number: 5,808,955
[45] Date of Patent: *Sep. 15, 1998

[54] INTEGRATED CIRCUIT MEMORY DEVICES INCLUDING SUB-WORD LINE DRIVERS AND RELATED METHODS

[75] Inventors: Hong-Sun Hwang; Seung-Moon Yoo, both of Kyungki-do, Rep. of Korea

[73] Assignee: Samsung Electronics Co., Ltd., Kyungki-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 680,389

[22] Filed: Jul. 15, 1996

[30] Foreign Application Priority Data

Jul. 15, 1995 [KR] Rep. of Korea ................... 95-20914

[51] Int. Cl.$^6$ ........................................................ G11C 8/00
[52] U.S. Cl. ........................ 365/230.06; 365/230.03; 365/189.11; 326/106
[58] Field of Search ........................ 365/230.06, 189.11, 365/230.03; 326/106, 107, 108

[56] References Cited

U.S. PATENT DOCUMENTS

| | | | |
|---|---|---|---|
| 5,394,375 | 2/1995 | Iwashita | 365/230.06 |
| 5,416,747 | 5/1995 | Ohira | 365/230.06 |
| 5,517,456 | 5/1996 | Chishiki | 365/230.03 |

OTHER PUBLICATIONS

Tadahiko Sugibayashi et al., *A 30–ns 256–Mb DRAM with a Multidivided Array Structure*, IEEE Journal of Solid–State Circuits, vol. 28, No. 11, Nov. 1993, pp. 1092–1098.

Primary Examiner—David C. Nelms
Assistant Examiner—Andrew Q. Tran
Attorney, Agent, or Firm—Myers Bigel Sibley & Sajovec

[57] ABSTRACT

An integrated circuit memory device includes a main row decoder, a sub-row decoder, and a sub-word line driver. The main row decoder decodes the first portion of a row address, and generates a main row activation signal when one of the plurality of rows have been selected. The sub-row decoder decodes a second portion of the row address, and generates a first sub-row activation signal when a first one of the plurality of rows has been selected. The sub-row decoder generates a second sub-row activation signal when a second one of the plurality of rows has been selected. The sub-word line driver activates a first memory cell in the first row in response to the main row activation signal and the first sub-row activation signal. The sub-word line driver activates a second memory cell of the second row in response to the main row activation signal and the second sub-row activation signal. The sub-word line driver includes a first driver circuit which activates the first memory cell in response to the main row activation signal, the first sub-row activation signal, and an inverse of the first sub-row activation signal. The sub-word line driver also includes a second driver circuit which activates a second memory cell in response to the main row activation signal, the second sub-row activation signal, and an inverse of the second sub-row activation signal.

21 Claims, 4 Drawing Sheets

5,808,955

INTEGRATED CIRCUIT MEMORY DEVICES INCLUDING SUB-WORD LINE DRIVERS AND RELATED METHODS

FIELD OF THE INVENTION

The present invention relates to the field of integrated circuits and more particularly to the field of integrated circuit memory devices.

BACKGROUND OF THE INVENTION

A dynamic random access memory (DRAM) includes a plurality of memory cells for storing data and associated peripheral circuits for reading and writing data to and from the memory cells. Each memory cell includes a cell capacitor for storing a charge representative of a data bit and a cell access transistor for controlling the input and output of the charge. FIG. 1 is a block diagram illustrating two memory cells of a dynamic random access memory together with sense amplifiers and a column select gate. FIG. 2 is a timing diagram illustrating a read operation for the device of FIG. 1. The operation of a conventional DRAM will now be discussed with reference to FIGS. 1 and 2.

When a row address strobe signal $\overline{RAS}$ or a column address strobe signal $\overline{CAS}$ are toggled to a logic low level, internal control signals are generated within the memory device. These internal control signals operate in accordance with a predetermined timing in order to perform the desired read operation. In a typical memory device, an address multiplexing method is used to reduce the chip size where an identical address line is controlled by the row address strobe signal and the column address strobe signal. Accordingly, the same address lines are used to input both the row address and the column address for a single read operation.

When a row address is designated, a boosted word line voltage is applied to the word line corresponding to the designated row address. When a column address is designated, the column selection line connected to a pair of bit lines corresponding to the designated column address is selected. When the word line for a particular memory cell is selected, the charge from that cell capacitor is distributed to one of a pair of bit lines in a charge sharing operation. Accordingly, a voltage difference is generated between the pair of bit lines.

A sense amplifier senses and amplifies the voltage difference between the bit lines, and the sense amplifier may have a P-N latch structure. A sense amplifier may be shared by adjacent memory cells in order to reduce a chip size of the memory device as shown in FIG. 1. As shown in FIG. 1, the memory cells 2 and 14 may be exclusively selected through use of the isolation gate control signals ISOi and ISOj. As an example, when memory cell 2 is selected, the first control signal ISOi goes to a logic high level by applying the boosting voltage Vpp, thus turning on isolation gates 4 and 6. At the same time, the second control signal ISOJ goes to a logic low level such as the ground voltage Vss thus turning isolation gates 16 and 18 off.

By turning the isolation gates 4 and 6 on, a voltage difference is generated between the bit lines BLi and $\overline{BLi}$ in response to a charge stored on the cell capacitor of memory cell 2. This voltage difference may be on the order of several tens of mVs to several hundreds of mVs. This voltage difference is then amplified by the N-type and P-type sense amplifiers 8 and 10, so that the bit line with the higher voltage is charged to the power supply voltage level Vcc, and the bit line with the lower voltage is discharged to the ground voltage Vss. A column decoder decodes a column address and activates a corresponding column select line to select a respective column select gate 12. Accordingly, the voltages of the bit line BLi and $\overline{BLi}$ are supplied to the input/output lines IO and $\overline{IO}$ and transferred to output pins of the memory device through a series of output circuits. In this manner, data can be read from individual memory cells.

When the word line WLi is selected, a charge sharing operation is performed between memory cell 2 and the bit line BLi which acts as a parasitic capacitor. If the sense amplifier operates before the charge sharing operation is complete, however, the voltage difference of the bit line pair BLi and $\overline{BLi}$ cannot be sufficiently amplified to the required potential difference thereby increasing the possibility of a malfunction. Accordingly, a sufficient time for the charge sharing operation must be insured, and this time is an important factor in the determination of the access time for the memory device.

In order to reduce the time required to perform the charge sharing operation between a memory cell and its associated bit line, the time required to charge the word line to a predetermined voltage level, such as Vcc+Vt where Vt is a threshold voltage of a memory cell access transistor, may be reduced. In particular, strapping methods have been used to reduce this time.

According to one strapping method, the gate poly used as the control electrode for the access transistor of the memory cell may have a relatively high resistance. To compensate for this resistance, a metal line having a relatively low resistance can be formed over the gate poly. Accordingly, the time required to select the word line is determined by the metal line thus providing an increase transmission speed and increasing the speed of the charge sharing operation.

Such a strapping method may be useful in a DRAM device with relatively large geometries, but this strapping method, however, may not be suitable for use with DRAM devices with relatively small geometries because of manufacturing tolerances. These manufacturing difficulties may result because the metal straps must be formed on a non-planar surface. Accordingly, for memory devices with over 256 Mb it may be difficult to form a metal line over every word line. In addition, it may be difficult to open a contact hole between the metal and the word line and then to fill this hole with the metal.

Accordingly, there has been proposed a method for making word lines having a hierarchy of structure. This hierarchy of structure is embodied with sub-word lines and sub-word line drivers which are used to designate the sub-word lines. A CMOS sub-word line driver according to the prior art is illustrated in FIG. 3. A main word line MWL is provided for every predetermined number of sub-word lines SWL, and one sub-word line is selected by the combination of the output of block decoder 22 and the main word line MWL. In particular, after the main word line MWL is activated to a logic low level by the main word line decoder 20, the boosting voltage is supplied from the block decoder 22 to the sub-word line SWLi or SWLj via PMOS transistor 30 or 34 of the CMOS sub-word line driver. Because a main word line MWL is not required for each sub-word line, the main word line can be manufactured with sufficient space to provide a metal ine thereon.

The CMOS sub-word line driver, however, uses PMOS transistors which require an N-type well formed on a P-type substrate thus lowering the density of the memory device. One approach to this problem has been discussed in the reference by Tadahiko Sugibayashi et al., entitled "A 30-ns 256-Mb DRAM with a Multidivided Array Structure", IEEE Journal of Solid-State Circuits, Vol. 28, No. 11, November 1993, pp. 1092–1098 (NEC Co., Japan). In this reference, a subword line driver having only NMOS transistors is discussed.

FIG. 4 illustrates a circuit diagram of the sub-word line driver discussed in the Tadahiko Sugibayashi et al. reference. In particular, when the row address strobe signal goes to the logic low level, a main row decoder 60 decodes a first portion of the row address, and a sub-row decoder 80 decodes a second portion of the row address. In addition, a node a of the sub-word line driver 100 is precharged to the $V_{BOOT}$–$V_{TN}$ voltage level by the main row decoder 60. If one of the lines $RA_{i-1}$ is then selected by the sub-row decoder 80, a respective sub-word line SWLi-j is selected.

The main word line, however, may be difficult to charge to the desired boosting voltage level $V_{BOOT}$ in the power-up and stand-by states. In particular, the boosting voltage level $V_{BOOT}$ is generated within the memory device and is clamped to a predetermined voltage level upon the power-up of the device. When in a stand-by state, the main word line MWL should be maintained at a ground voltage level Vss and the complementary main word line $\overline{MWL}$ should be maintained at the boosting level voltage $V_{BOOT}$.

In a 16 Mb DRAM, the load of the signal lines may be on the order of about 6 nF. With a 256 Mb DRAM, however, the load of the signal lines may increase to several tens of nF. Accordingly, it may be difficult to charge up the main word line to a desirable boosting voltage level $V_{BOOT}$ during the power-up and stand-by states in a 256 Mb DRAM.

Furthermore, the stand-by current may increase if a micro bridge occurs. As shown in FIG. 4, a pair of main word lines MW and $\overline{MW}$ are charged with opposite voltage potentials and run parallel to one another. In the stand-by state, the main word line MW, stays at the ground voltage level Vss and the complementary main word line $\overline{MW}$ stays at the boosting voltage level $V_{BOOT}$. Accordingly, if a micro bridge occurs between these two lines, a current path is formed from the boosting voltage level $V_{BOOT}$ to the ground voltage level Vss, thus draining the boosting voltage level $V_{BOOT}$.

Because the boosting voltage level $V_{BOOT}$ is generated within the memory device, when the boosting voltage level is drained, circuits within the memory device such as the oscillator and a detector may operate continuously to restore the boosting voltage to its original level. This continuous operation may cause an increase in the stand-by current, and this increased stand-by current may remain even if the function of the shorted word lines is replaced by redundant word lines. Furthermore, in highly integrated memory devices with relatively small geometries, a micro bridge is more likely to recur. The increased stand-by current caused by such a micro bridge may affect an increased failure rate of the memory device.

SUMMARY OF THE INVENTION

It is therefore an object of the present invention to provide improved integrated circuit memory devices and related methods.

It is another object of the present invention to provide integrated circuit memory devices and methods which reduce the loading of a boosting voltage generator.

It is still another object of the present invention to provide integrated circuit memory devices and methods with relatively high memory access speeds.

It is yet another object of the present invention to provide integrated circuit memory devices and methods which reduce the occurrence of micro bridges between adjacent lines.

These and other objects are provided according to the present invention by a sub-word line driver including first and second driver circuits. The first driver circuit activates a first memory cell in a first row of memory cells in response to the main row activation signal, the first sub-row activation signal, and an inverse of the first sub-row activation signal. The second driver circuit activates a second memory cell in a second row of memory cells in response to the main row activation signal, the second sub-row activation signal, and an inverse of the second sub-row activation signal. Accordingly, there is no need for an inverse main word line running parallel to the main word line, thus reducing the potential for a short between the ground voltage and the boosting voltage. The power consumption of the memory device using the sub-word line driver of the present invention can thus reduce the current consumed when in the stand-by state.

In particular, the first driver circuit can include a first inverter, a first sub-word line, a first pull-down circuit, and a first pull-up circuit. The first inverter inverts the first sub-row activation signal, and the first sub-word line is connected to the first memory cell. The pull-down circuit disconnects the first sub-word line from a reference voltage in response to the inverted first sub-row activation signal. The first pull-up circuit connects the first sub-word line to the main row activation signal in response to the first sub-row activation signal. The second driver circuit can have a second inverter, a second sub-word line connected to a second memory cell, a second pull-down circuit, and a second pull up circuit connected as discussed above with regard to the first driver circuit.

An integrated circuit memory device including the sub-word line driver of the present invention can thus operate with reduced current consumption in the stand-by state while providing increased memory access speed.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
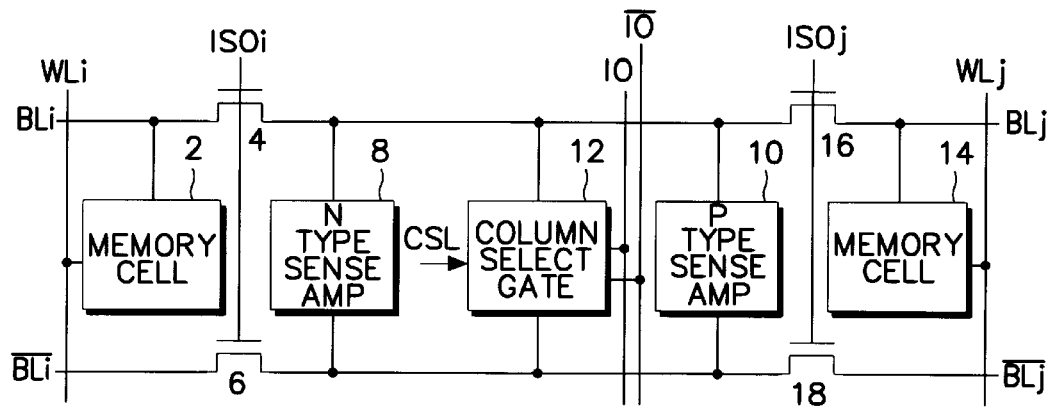
FIG. 1 is a block diagram illustrating two memory cells and associated peripheral circuits for an integrated circuit memory device according to the prior art.
Figure 2:
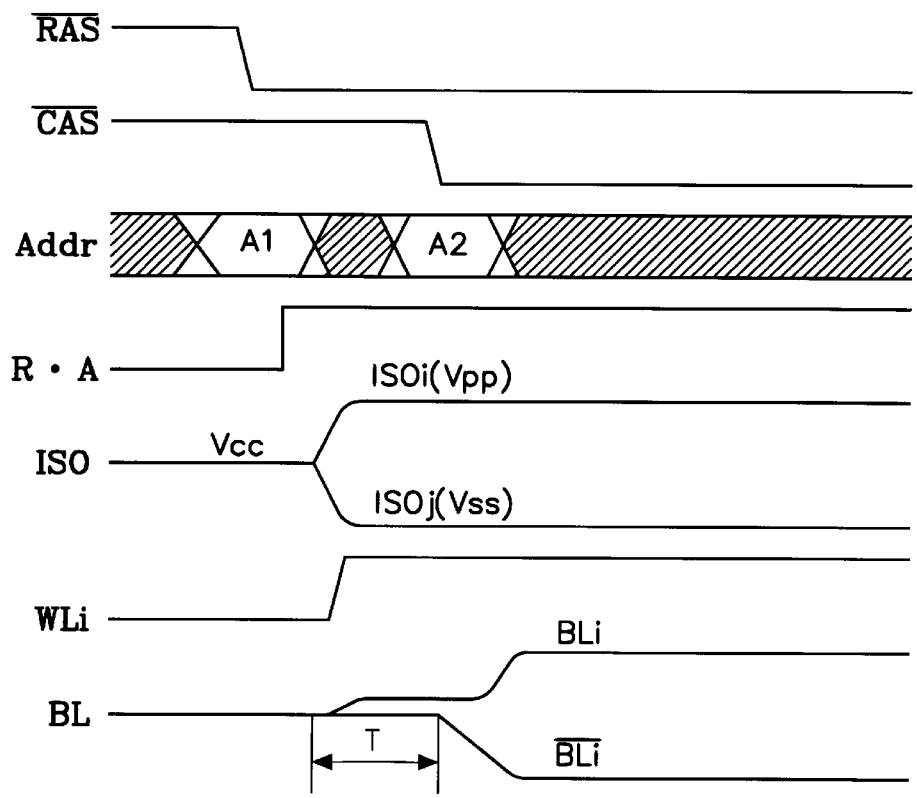
FIG. 2 is a timing diagram illustrating a read operation for the integrated circuit memory device of FIG. 1.
Figure 3:
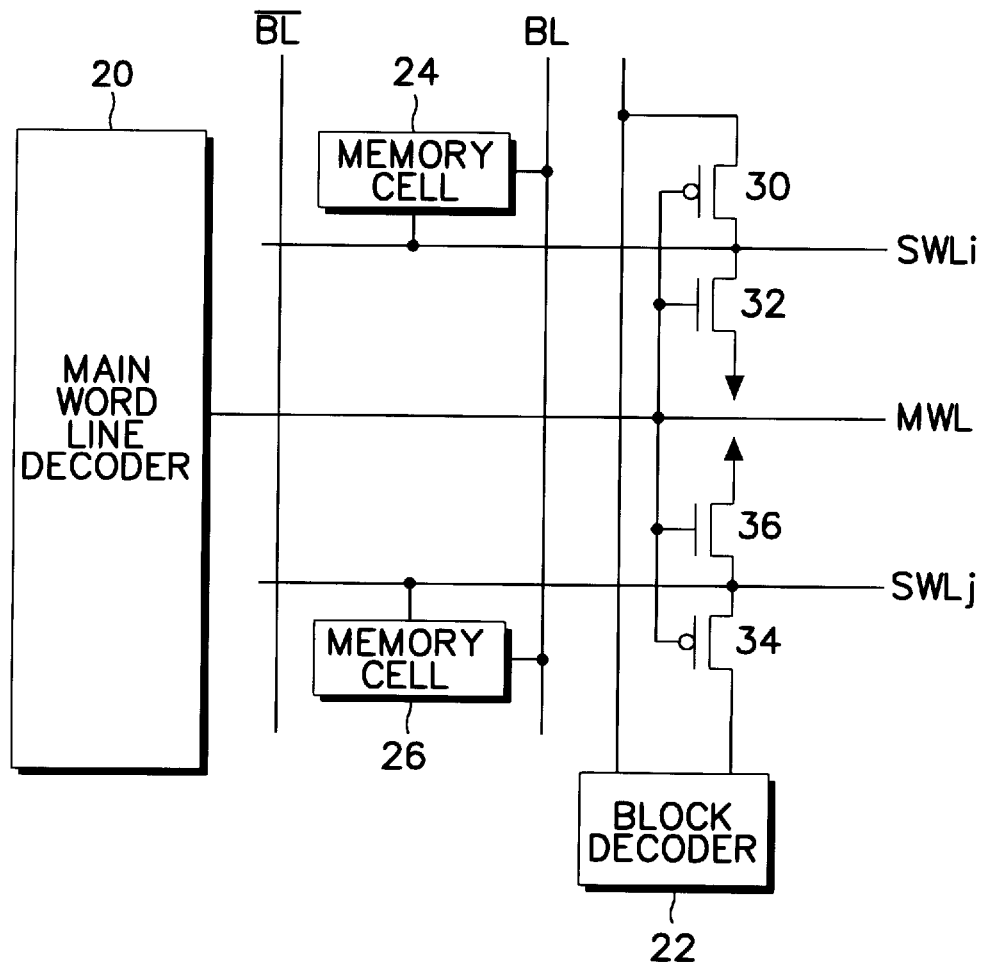
FIG. 3 is a circuit diagram illustrating a CMOS sub-word line driver according to the prior art.
Figure 4:
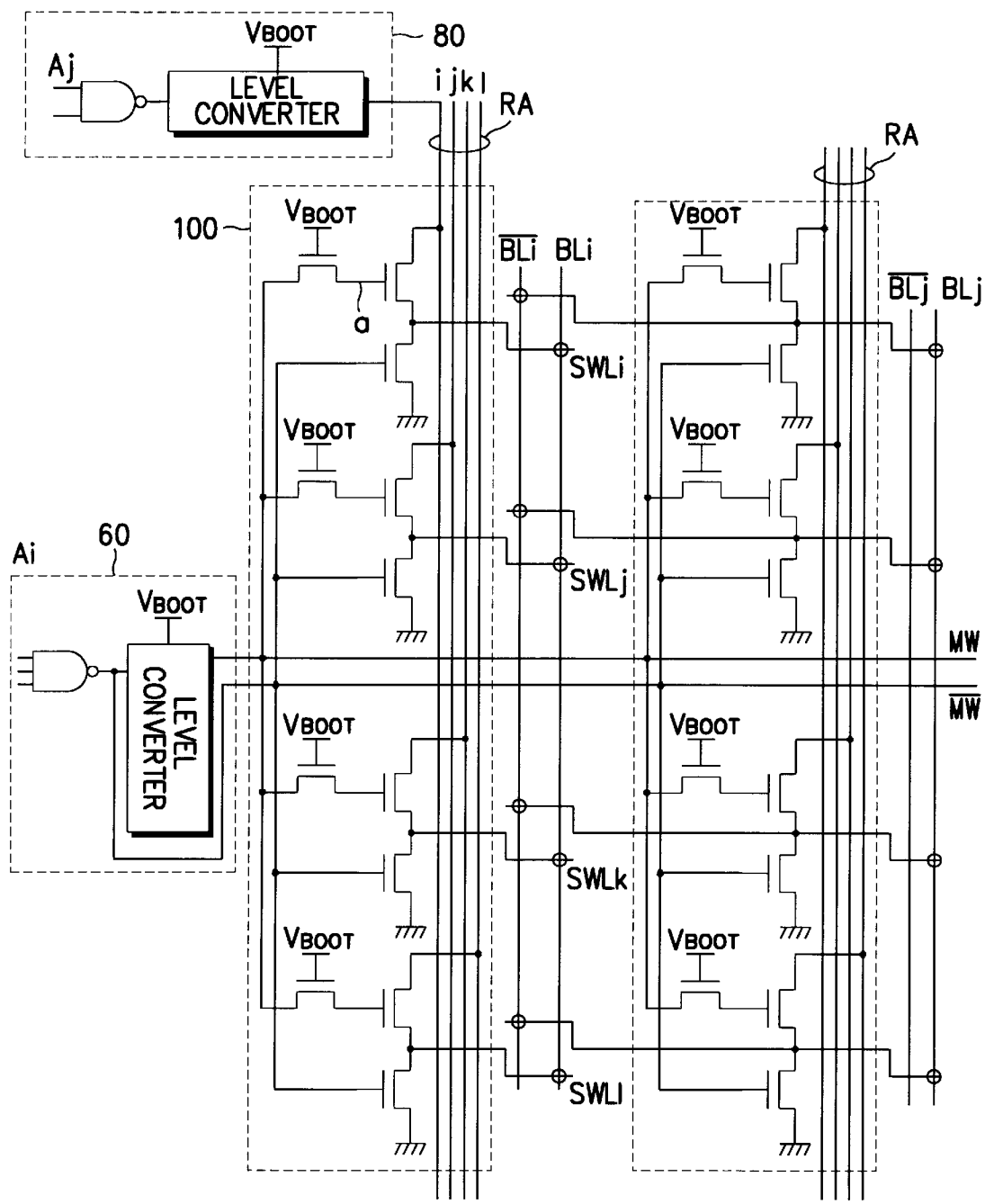
FIG. 4 is a circuit diagram illustrating an NMOS sub-word line driver according to the prior art.
Figure 5:
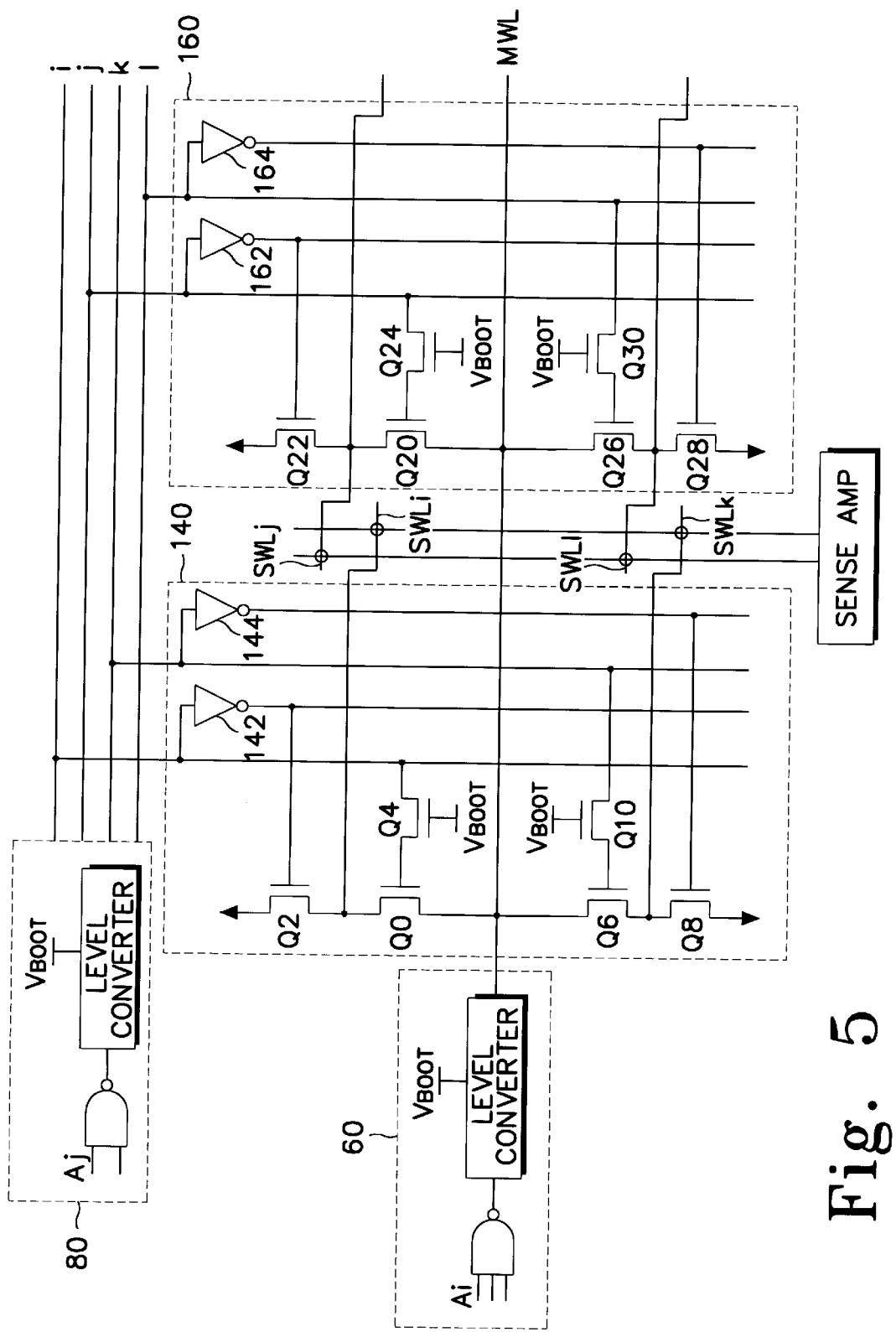
FIG. 5 is a circuit diagram illustrating an NMOS sub-word line driver according to the present invention.

FIG. 5 illustrates a circuit diagram of two sub-word line drivers for an integrated circuit memory device according to the present invention. A main row decoder 60 decodes a first portion Ai of the row address, and a level converter connects the decoded signal to the main word line MWL. A sub-row decoder 80 decodes a second portion Aj of the row address, and a level converter connects the decoded signal to the address lines i, j, k, and 1.

The sub-word line driver 140 includes a first pull-up transistor Q0 with its channel connected between the main word line MWL and the first sub-word line SWLi. A first pull-down circuit Q2 has a channel connected between the first sub-word line SWLi and the ground voltage Vss. A first precharge circuit Q4 has a channel connected between the first address line i and the control electrode of the first pull-up transistor Q0. The control electrode of the precharge circuit Q4 is connected to the boosting voltage $V_{BOOT}$, which is greater than an internal power supply voltage level for the integrated circuit memory device.

A second pull-up transistor Q6 has a channel connected between the main word line MWL and the second sub-word line SWLk. A second pull-down circuit Q8 has a channel connected between the second sub-word line SWLk and the ground voltage Vss. A second precharge circuit Q10 has a channel connected between the second decoded address line k and the control electrode of the second pull-up transistor Q6. The control electrode of the second precharged circuit Q10 is connected to the boosting voltage $V_{BOOT}$.

A first inverter 142 has an input terminal connected to the first decoded address line i and an output terminal connected to the control electrode of the first pull-down transistor Q2. A second inverter 144 has an input terminal connected to the second decoded address line k and an output terminal connected to the control electrode of the second pull-down transistor Q8. The sub-word line driver 160 has a structure identical to that of the sub-word line driver 140. The sub-word line driver 160 receives the third and fourth decoded address lines j and l which are not connected to the sub-word line driver 140. The subword line driver 160 generates outputs on the third and fourth sub-word lines SWLj and SWLl.

When the row address strobe signal $\overline{RAS}$ is at a logic high state, the memory device is maintained in the stand-by state with the main word line MWL at the ground voltage level. When the row address strobe signal $\overline{RAS}$ is transitioned to the logic low level, the memory device changes to an activated state, and addresses applied from outside the chip are latched as row addresses by a row address buffer. The sub-row decoder 80 decodes the least significant two bits of the row address, and then transfers the boosting voltage $V_{BOOT}$ to the appropriate decoded address line i, j, k, or l via the level converter. In the example discussed below, the boosting voltage $V_{BOOT}$ is applied to the first decoded address line i for convenience of description.

The main row decoder 60 decodes the other portion of the row address and transfers the boosting voltage $V_{BOOT}$ to the main word line MWL if selected. The boosting voltage is transferred from the main word line to the sub-word line as discussed below. Only one of the four decoded address lines is driven to the logic high level while the remaining decoded address lines are maintained at the logic low level.

In the following example, the address line i is driven to the logic high level, while the address lines j, k, and l are driven to the logic low level. Accordingly, the output of the first inverter 142 is driven to a logic low level, and the output of the other inverters 144, 162 and 164 are all driven to the logic high level. As a result, the pull-down transistors Q8, Q22, and Q28 are turned on creating a conductive path from the sub-word lines SWLj, SWLk, and SWLl to the ground voltage. In contrast, the pull-down transistor Q2 is turned off disconnecting sub-word line SWLi from the ground voltage.

The end of the first precharged circuit Q4 of the sub-word line driver 140 is precharged to the voltage level $V_{BOOT}$-Vth where Vth is a threshold voltage for the precharge transistor. Thereafter, the boosting voltage $V_{BOOT}$ is supplied from the main word line WML to the sub-word line SWLi through the first pull-up transistor Q0. After this sub-word line activation operation, a charge sharing operation is performed between the memory cell capacitor and the bit line associated with the sub-word line SWLi. The sense amplifier senses a resulting voltage difference between the bit lines and amplifies this difference to a CMOS level potential difference. Data stored at the memory cell capacitor is then transferred to the input/output line through the column select gate to an output through a series of data path control circuits.

According to the sub-word line driver discussed above, the main word line MWL is maintained at the ground voltage level in the stand-by state so that the number of lines charged to the boosting voltage level is reduced. Accordingly, the drain on the boosting voltage during the power-up and the standby states can be reduced. In addition, because there is one main word line per four sub-word lines with no parallel inverse main word line, and because the precharge voltage level of the main word line is the ground voltage level, the occurrence of micro bridges between adjacent word lines can be reduced. Furthermore, even if a micro bridge occurs between adjacent word lines, the discharge path can be isolated by replacing the word lines with redundant word lines.

The yield and overall performance of the DRAM device can thus be enhanced. An integrated circuit memory device using the sub-word line driver discussed above thus allows the use of metal straps with the word lines in highly integrated memory devices with small geometries while reducing the occurrence of micro bridges. Memory devices with improved performance can thus be realized.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A sub-word line driver for an integrated circuit memory device having an array of memory cells arranged into rows and columns, a main row decoder associated with a plurality of the rows of memory cells which generates a main row activation signal when one of the plurality of rows of memory cells has been selected, and a sub-row decoder associated with the plurality of rows of memory cells which generates a first sub-row activation signal when a first one of the plurality of rows has been selected, which generates a second sub-row activation signal when a second one of the plurality of rows has been selected, which generates a third sub-row activation signal when a third one of the plurality of rows has been selected, and which generates a fourth sub-row activation signal when a fourth one of the plurality of rows has been selected, said sub-word line driver comprising:

a first driver circuit coupled to a first memory cell in the first row of memory cells which activates the first memory cell in response to the main row activation signal, the first sub-row activation signal, and an inverse of the first sub-row activation signal;

a first precharge transistor having a first control gate driven by a boosting voltage greater than an internal power supply level for the integrated circuit memory device wherein said first sub-row activation signal is provided to said first driver circuit through said first precharge transistor;

a second driver circuit coupled to a second memory cell in the second row of memory cells which activates the second memory cell in response to the main-row activation signal, the second sub-row activation signal, and an inverse of the second sub-row activation signal;

a second precharge transistor having a second control gate driven by said boosting voltage wherein said second sub-row activation signal is provided to said second driver circuit through said second precharge transistor;

a third driver circuit coupled to a third memory cell in the third row of memory cells which activates the third memory cell in response to the main row activation signal, the third sub-row activation signal, and an inverse of the third sub-row activation signal;

a third precharge transistor having a third control gate driven by said boosting voltage wherein said third sub-row activation signal is provided to said third driver circuit throuah said third precharge transistor a fourth driver circuit coupled to a fourth memory cell in the fourth row of memory cells which activates the fourth memory cell in response to the main-row activation signal, the fourth sub-row activation signal, and an inverse of the fourth sub-row activation signal; and a fourth precharge transistor having a fourth control gate driven by said boosting voltage wherein said fourth sub-row activation signal is provided to said fourth driver circuit through said fourth precharge transistor.

2. A sub-word line driver according to claim 1 wherein:

said first driver circuit comprises a first inverter which inverts the first sub-row activation signal, a first sub-word line connected to the first memory cell, a first pull-down circuit which disconnects said first sub-word line from a reference voltage in response to the inverted first sub-row activation signal, and a first pull-up circuit which connects the first sub-word line to the main row activation signal in response to the first sub-row activation signal; and said second driver circuit comprises, a second inverter which inverts the second sub-row activation signal, a second sub-word line connected to the second memory cell, a second pull-down circuit which disconnects said second sub-word line from said reference voltage in response to the inverted second sub-row activation signal, and a second pull-up circuit which connects the second sub-word line to the main row activation signal in response to the second sub-row activation signal.

3. A sub-word line driver according to claim 2 wherein said first and second pull-down circuits and said first and second pull-up circuits comprise NMOS transistors.

4. A sub-word line driver according to claim 2 wherein said main-row activation signal is maintained at said boosting voltage level when one of the plurality of memory cells has been selected, wherein said boosting voltage level is greater than an internal power supply voltage level for the integrated circuit memory device.

5. A sub-word line driver according to claim 4 wherein said main row activation signal is maintained at a ground voltage level when none of the plurality of memory cells has been selected.

6. A sub-word line driver according to claim 2 wherein said first sub-word line, said first pull-down circuit, said first pull-up circuit, said second sub-word line, said second pull-down circuit, and said second pull-up circuit are positioned on a first side of a main word line, and wherein said third sub-word line, said third pull-down circuit, said third pull-up circuit, said fourth sub-word line, said fourth pull-down circuit, and said fourth pull-up circuit are positioned on a second side of said main word line opposite said first side.

7. A sub-word line driver according to claim 1 wherein said main row activation signal is provided on a main word line, wherein said first and second driver circuits are positioned on a first side of said main word line, and wherein said third and fourth driver circuits are positioned on a second side of said main word line.

8. An integrated circuit memory device comprising:

an array of memory cells arranged into rows and columns;

a main row decoder associated with a plurality of the rows of memory cells wherein said main row decoder decodes a first portion of a row address and wherein said main row decoder generates a main row activation signal when one of the plurality of rows of memory cells has been selected;

a sub-row decoder associated with the plurality of rows of memory cells wherein said sub-row decoder decodes a second portion of the row address and wherein said sub-row decoder generates a first sub-row activation signal when a first one of the plurality of rows has been selected, wherein said sub-row decoder generates a second sub-row activation signal when a second one of the plurality of rows has been selected, wherein said sub-row decoder generates a third sub-row activation signal when a third one of the plurality of rows has been selected, and wherein said sub-row decoder generates a fourth sub-row activation signal when a fourth one of the plurality of rows has been selected; and a sub-word line driver which activates a first memory cell in said first row of memory cells in response to said main row activation signal and said first sub-row activation signal, which activates a second memory cell in said second row of memory cells in response to said main row activation signal and said second sub-row activation signal, which activates a third memory cell in said third row of memory cells in response to said main row activation signal and said third sub-row activation signal, and which activates a fourth memory cell in said fourth row of memory cells in response to said main row activation signal and said fourth sub-row activation signal, said sub-word line driver comprising, a first driver circuit coupled to the first memory cell which activates the first memory cell in response to the main row activation signal, the first sub-row activation signal, and an inverse of the first sub-row activation signal, a first precharge transistor having a first control gate driven by a boosting voltage greater than an internal power supply level for the integrated circuit memory device wherein said first sub-row activation signal is provided to said first driver circuit through said first precharge transistor, a second driver circuit coupled to the second memory cell which activates the second memory cell in response to the main row activation signal, the second sub-row activation signal, and an inverse of the second sub-row activation signal, a second precharge transistor having a second control gate driven by said boosting voltage wherein said second sub-row activation signal is provided to said second driver circuit through said second precharge transistor;

a third driver circuit coupled to the third memory cell which activates the third memory cell in response to the main row activation signal, the third sub-row activation signal, and an inverse of the third sub-row activation signal, a third precharge transistor having a third control gate driven by said boosting voltage wherein said third sub-row activation signal is provided to said third driver circuit through said third precharge transistor, a fourth driver circuit coupled to the fourth memory cell which activates the fourth memory cell in response to the main row activation signal, the fourth sub-row activation signal, and an inverse of the fourth sub-row activation signal, and a fourth precharge transistor having a fourth control gate driven by said boosting voltage wherein said fourth sub-row activation signal is provided to said fourth driver circuit through said fourth precharge transistor.

9. An integrated circuit memory device according to claim 8 wherein:

said first driver circuit comprises a first inverter which inverts the first sub-row activation signal, a first sub-word line connected to the first memory cell, a first pull-down circuit which disconnects said first sub-word line from a reference voltage in response to the inverted first sub-row activation signal, and a first pull-up circuit which connects the first sub-word line to the main row activation signal in response to the first sub-row activation signal; and said second driver circuit comprises, a second inverter which inverts the second sub-row activation signal, a second sub-word line connected to the second memory cell, a second pull-down circuit which disconnects said second sub-word line from said reference voltage in response to the inverted second sub-row activation signal, and a second pull-up circuit which connects the second sub-word line to the main row activation signal in response to the second sub-row activation signal.

10. An integrated circuit memory device according to claim 9 wherein said first and second pull-down circuits and said first and second pull-up circuits comprise NMOS transistors.

11. An integrated circuit memory device according to claim 9 wherein said main row activation signal is maintained at said boosting voltage level when one of the plurality of memory cells has been selected, wherein said boosting voltage level is greater than an internal power supply voltage level for the integrated circuit memory device.

12. An integrated circuit memory device according to claim 11 wherein said main row activation signal is maintained at a ground voltage level when none of the plurality of memory cells has been selected.

13. An integrated circuit memory device according to claim 9 wherein:

said third driver circuit comprises a third inverter which inverts the third sub-row activation signal, a third sub-word line connected to the third memory cell, a third pull-down circuit which disconnects said third sub-word line from said reference voltage in response to the inverted third sub-row activation signal, and a third pull-up circuit which connects the third sub-word line to the main row activation signal in response to the third sub-row activation signal;

said fourth driver circuit comprises a fourth inverter which inverts the fourth sub-row activation signal, a fourth sub-word line connected to the fourth memory cell, a fourth pull-down circuit which disconnects said fourth sub-word line from said reference voltage in response to the inverted fourth sub-row activation signal, and a fourth pull-up circuit which connects the fourth sub-word line to the main row activation signal in response to the fourth sub-row activation signal;

said first sub-word line, said first pull-down circuit, said first pull-up circuit, said second sub-word line, said second pull-down circuit, said second pull-up circuit are positioned on a first side of a main word line; and said third sub-word line, said third pull-down circuit, said third pull-up circuit, said fourth sub-word line, said fourth pull-down circuit, said fourth pull-up circuit are positioned on a second side of said main word line opposite said first side of said main word line.

14. An integrated circuit memory device according to claim 8 wherein said main row activation signal is provided on a main word line, wherein said first and second driver circuits are positioned on a first side of said main word line, and wherein said third and fourth driver circuits are positioned on a second side of said main word line opposite said first side.

15. A sub-word line driver for an integrated circuit memory device having an array of memory cells arranged into rows and columns, a main row decoder associated with a plurality of the rows of memory cells which decodes a first portion of a row address and which generates a main row activation signal on a main word line when one of the plurality of rows of memory cells has been selected, and a sub-row decoder associated with the plurality of rows of memory cells which decodes a second portion of the row address and which generates a first sub-row activation signal when a first one of the plurality of rows has been selected, which generates a second sub-row activation signal when a second one of the plurality of rows has been selected, which generates a third sub-row activation signal when a third one of the plurality of rows has been selected, and which generates a fourth sub-row activation signal when a fourth one of the plurality of rows has been selected, said sub-word line driver comprising:

a first inverter coupled to the sub-row decoder which inverts the first sub-row activation signal;

a first pull-down transistor coupled to said first inverter which disconnects a first sub-word line from a reference voltage in response to the inverted first sub-row activation signal;

a first pull-up transistor coupled to the sub-row decoder which connects the first sub-word line to the main word line in response to the first sub-row activation signal;

a first precharge transistor having a first control gate driven by a boosting voltage greater than an internal power supply level for the integrated circuit memory device wherein said first sub-row activation signal is provided to said first pull-up transistor through said first precharge transistor;

a second inverter coupled to the sub-row decoder which inverts the second sub-row activation signal;

a second pull-down transistor coupled to said second inverter which disconnects a second sub-word line from said reference voltage in response to the inverted second sub-row activation signal;

a second pull-up transistor coupled to the sub-row decoder which connects the second sub-word line to the main word line in response to the second sub-row activation signal;

a second precharge transistor having a second control gate driven by said boosting voltage wherein said second sub-row activation signal is provided to said second pull-up transistor through said second precharge transistor;

a third inverter coupled to the sub-row decoder which inverts the third sub-row activation signal;

a third pull-down transistor coupled to said third inverter which disconnects a third sub-word line from said reference voltage in response to the inverted third sub-row activation signal;

a third pull-up transistor coupled to the sub-row decoder which connects the third sub-word line to the main word line in response to the third sub-row activation signal;

a third precharge transistor having a third control gate driven by said boosting voltage wherein said third sub-row activation signal is provided to said third pull-up transistor through said third precharge transistor;

a fourth inverter coupled to the sub-row decoder which inverts the fourth sub-row activation signal;

a fourth pull-down transistor coupled to said fourth inverter which disconnects a fourth sub-word line from said reference voltage in response to the inverted fourth sub-row activation signal;

a fourth pull-up transistor coupled to the sub-row decoder which connects the fourth sub-word line to the main word line in response to the fourth sub-row activation signal; and a fourth precharge transistor having a fourth control gate driven by said boosting voltage wherein said fourth sub-row activation signal is provided to said fourth pull-up transistor through said fourth precharge transistor.

16. A sub-word line driver according to claim 15 wherein said reference voltage comprises a ground voltage.

17. A sub-word line driver according to claim 15 wherein said first and second pull-down transistors and said first and second pull-up transistors each comprise NMOS transistors.

18. A sub-word line driver according to claim 15 wherein said main row activation signal is generated at said boosting voltage level when one of the plurality of rows of memory cells has been selected, wherein said boosting voltage level is greater than an internal power supply voltage level for the integrated circuit memory device.

19. A sub-word line driver according to claim 18 wherein said main row activation signal is maintained at a ground voltage level when none of the plurality of memory cells has been selected.

20. A sub-word line driver according to claim 15 wherein the sub-row decoder decodes two bits of the row address.

21. A sub-word line driver according to claim 15 wherein said main row activation signal is provided on said main word line, wherein said first and second pull-down transistors, and said first and second pull-up transistors are positioned on a first side of said main word line, and wherein said third and fourth pull-down transistors, and said third and fourth pull-up transistors are positioned on a second side of said main word line.

* * * * *